United States Patent
Lin et al.

(10) Patent No.: US 9,530,783 B2
(45) Date of Patent: Dec. 27, 2016

(54) METHOD OF MANUFACTURING NON-VOLATILE MEMORY HAVING SONOS MEMORY CELLS

(71) Applicant: UNITED MICROELECTRONICS CORPORATION, Hsinchu (TW)

(72) Inventors: Sung-Bin Lin, Hsinchu (TW); Wen-Chung Chang, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/729,086

(22) Filed: Jun. 3, 2015

(65) Prior Publication Data

US 2016/0336337 A1    Nov. 17, 2016

(30) Foreign Application Priority Data

May 11, 2015   (CN) .......................... 2015 1 0235948

(51) Int. Cl.
*H01L 27/115*    (2006.01)
*H01L 29/792*    (2006.01)

(52) U.S. Cl.
CPC ....... *H01L 27/11563* (2013.01); *H01L 27/115* (2013.01); *H01L 27/11517* (2013.01); *H01L 27/11521* (2013.01); *H01L 27/11526* (2013.01); *H01L 27/11568* (2013.01); *H01L 27/11573* (2013.01); *H01L 29/792* (2013.01)

(58) Field of Classification Search
CPC ............ H01L 27/1052; H01L 27/11563; H01L 27/11568; H01L 27/11517; H01L 27/11521; H01L 27/115; H01L 27/11526; H01L 27/11573; H01L 29/792
See application file for complete search history.

(56) References Cited

U.S. PATENT DOCUMENTS

| | | | |
|---|---|---|---|
| 6,306,706 B1 | 10/2001 | Chan | |
| 6,372,577 B1 | 4/2002 | Fang | |
| 6,900,514 B2 * | 5/2005 | Kanai | H01L 27/0629 257/516 |
| 7,005,348 B2 * | 2/2006 | Lee | H01L 21/28282 257/330 |
| 7,534,684 B2 * | 5/2009 | Lee | H01L 27/105 257/E21.679 |
| 8,629,025 B2 * | 1/2014 | Chen | H01L 29/792 257/324 |
| 8,685,813 B2 * | 4/2014 | Ramkumar | H01L 21/28282 257/314 |

(Continued)

OTHER PUBLICATIONS

Hollauer, "Dissertation: Section 2.2 Principles of the Oxidation Process," Jan. 18, 2008.*

*Primary Examiner* — Joseph C Nicely
(74) *Attorney, Agent, or Firm* — Ding Yu Tan (57) ABSTRACT

A method for manufacturing a non-volatile memory with SONOS memory cells, which includes steps of: providing a substrate; forming a first gate oxide layer and a first gate conductive layer onto the substrate; forming a MOS transistor gate by executing a photolithography process on the first gate conductive layer, and then forming an ONO structure on the substrate; and forming a second gate conductive layer on the ONO substrate, and then forming a NVM transistor gate by executing a photolithography process on the second gate conductive layer.

4 Claims, 10 Drawing Sheets

(56) References Cited

U.S. PATENT DOCUMENTS

| | | | |
|---|---|---|---|
| 8,796,098 B1* | 8/2014 | Ramkumar | H01L 29/66833 257/324 |
| 9,171,915 B1* | 10/2015 | Chen | H01L 29/401 |
| 2002/0031888 A1 | 3/2002 | Fang | |
| 2003/0001225 A1* | 1/2003 | Goda | H01L 21/76232 257/499 |
| 2004/0007734 A1* | 1/2004 | Kato | H01L 21/28282 257/324 |
| 2004/0070033 A1* | 4/2004 | Shin | H01L 27/0629 257/379 |
| 2004/0082198 A1* | 4/2004 | Nakamura | H01J 37/32192 438/787 |
| 2006/0228899 A1* | 10/2006 | Nansei | H01L 21/3145 438/769 |
| 2007/0048933 A1* | 3/2007 | Fujita | H01L 27/0629 438/253 |
| 2007/0272971 A1* | 11/2007 | Lee | H01L 27/105 257/321 |
| 2008/0057644 A1* | 3/2008 | Kwak | H01L 21/76224 438/257 |
| 2008/0217678 A1* | 9/2008 | Tan | H01L 21/28282 257/324 |
| 2008/0251835 A1* | 10/2008 | Hashimoto | H01L 29/42332 257/321 |
| 2011/0215395 A1* | 9/2011 | Golubovic | H01L 27/11568 257/326 |
| 2013/0178031 A1* | 7/2013 | Ramkumar | H01L 21/823412 438/287 |
| 2013/0307053 A1* | 11/2013 | Polishchuk | H01L 29/4234 257/325 |
| 2014/0264531 A1* | 9/2014 | Goyo | H01L 29/66825 257/316 |

\* cited by examiner

METHOD OF MANUFACTURING NON-VOLATILE MEMORY HAVING SONOS MEMORY CELLS

FIELD OF THE INVENTION

The present invention generally relates to a structure and the manufacture method of a non-volatile memory (NVM) and, particularly to a structure and the manufacture method of a embedded flash memory with Silicon-Oxide-Nitride-Oxide-Silicon (SONOS) structures in memory cells.

BACKGROUND OF THE INVENTION

A non-volatile memory, as one kind of various memories, has the advantage of that the stored data would not disappear after power down, and thus can be deemed as a data storage device such as a hard disk. It is distinguished from mainstream flash by the use of silicon nitride($Si_3N_4$) instead of polysilicon for the charge storage material. SONOS promises lower programming voltages and higher program/erase cycle endurance than polysilicon-based flash.

Figure 1:
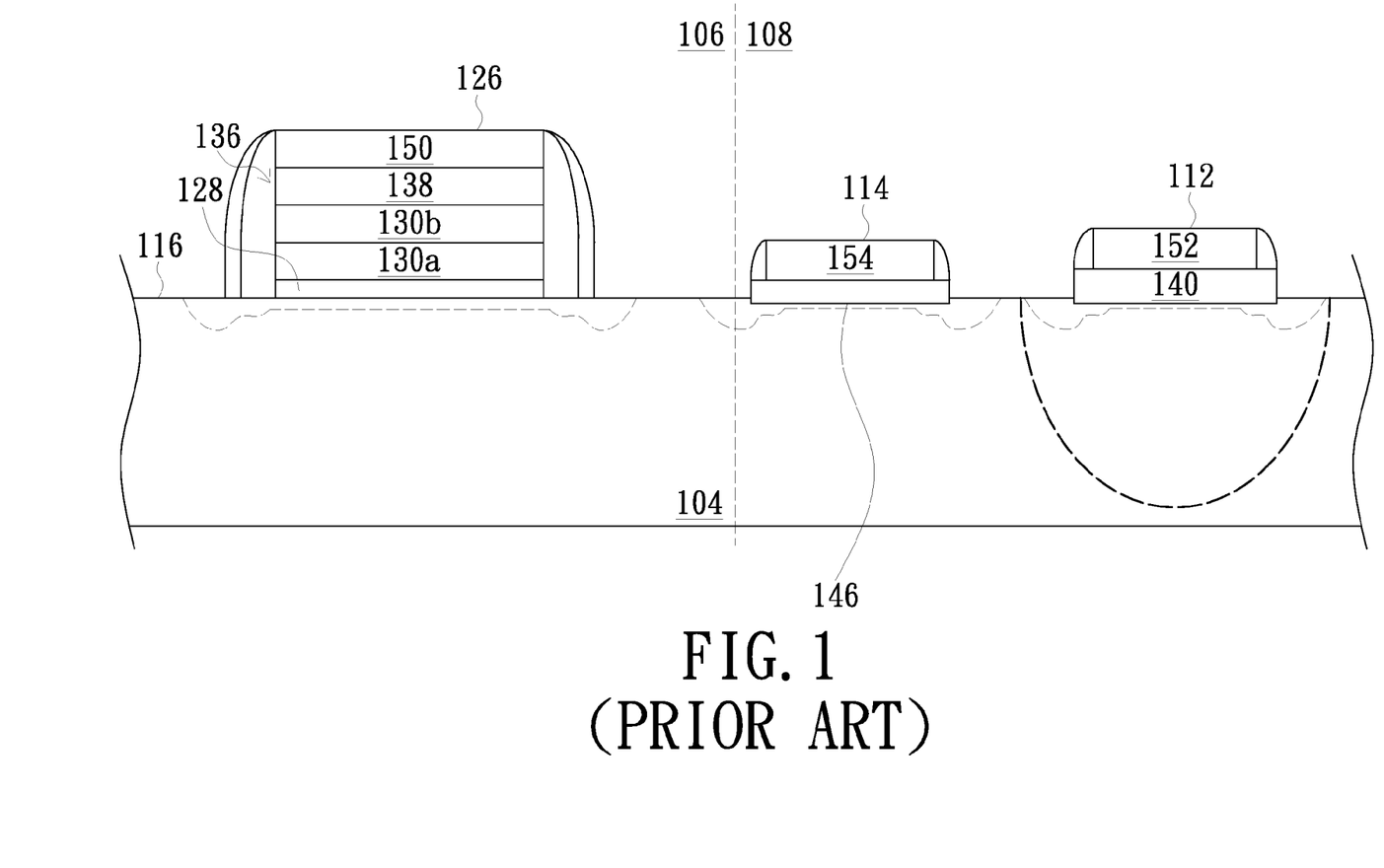
FIG. 1 is a schematic cross-sectional view of a conventional SONOS memory.

As shown in FIG. 1, a NVM with SONOS memory cells includes a substrate 104 with a surface 116, which is divided into a memory area 106 having several NVM transistors 126; and a logic area 108 having several metal-oxide-semiconductor (MOS) transistors 112 and 114. One NVM transistor 126 is constructed by an ONO structure 136 and gate 150 The ONO structure 136 includes a tunnel dielectric layer 128, a plurality of charge trapping layers 130a and 130b, and a blocking oxide layer 138, which are stacked together one by one. The MOS transistors 112 and 114 are constructed by the gate oxide layers 140/146 and the gates 152/154, respectively.

In the conventional manufacture process of a non-volatile memory (NVM), the ONO structure 136 is formed before the formation of the gate oxide layer 140/146. Accordingly, the blocking oxide layer 138 might be lost in the following process, which will worsen the thickness control of the blocking oxide layer 138, and thus negatively influence the stability of the voltage operation.

Furthermore, since the elements in the memory area 106 and the logic area 108 will be manufactured simultaneously, there might be SiN resided within the ONO structure 136 of the memory area 104 after the etching process of the gate conductive layer of the logic area 108, which will influence the quality of the product.

Moreover, in a batch manufacturing process, the nitride of the exposed ONO structure will inhibit the growth of the oxide layer in the logic area 108, which will also cause thickness control problems.

Therefore, to solve the above-mentioned problems will be the main object of the invention.

SUMMARY OF THE INVENTION

The present invention provides a method for manufacturing a non-volatile memory with SONOS memory cells, which includes steps of: providing a substrate; forming a first gate oxide layer and a first gate conductive layer onto the substrate; forming a MOS transistor gate by executing a photolithography process on the first gate conductive layer, and then forming an ONO structure on the substrate; and forming a second gate conductive layer on the ONO substrate, and then forming a NVM transistor gate by executing a photolithography process on the second gate conductive layer.

When etching the second gate conductive layer, the ONO structure serves as a hard mask of the MOS transistor gate.

While etching the first gate conductive layer, a portion of the first gate conductive layer which is not used for forming the MOS transistor gate is remained for forming a capacitor structure with the ONO structure.

While etching the second gate conductive layer, a portion of the second gate conductive layer which is not used for forming the NVM transistor gate is remained for forming a resistor with a desired electrical resistance.

The present invention further provides non-volatile memory with SONOS memory cells, which includes a substrate, having a surface divided into a memory area and a logic area; a MOS transistor formed within the logic area, which includes a gate oxide layer formed on the surface of the substrate, and a MOS transistor gate formed above the gate oxide layer; and a NVM transistor formed within the memory gate, which includes an ONO structure formed on the substrate, and a NVM transistor gate formed above the ONO structure; wherein the junction of the ONO structure and the substrate is lower than the surface of the substrate.

The resistances of the MOS transistor gate and the NVM transistor gate are different.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
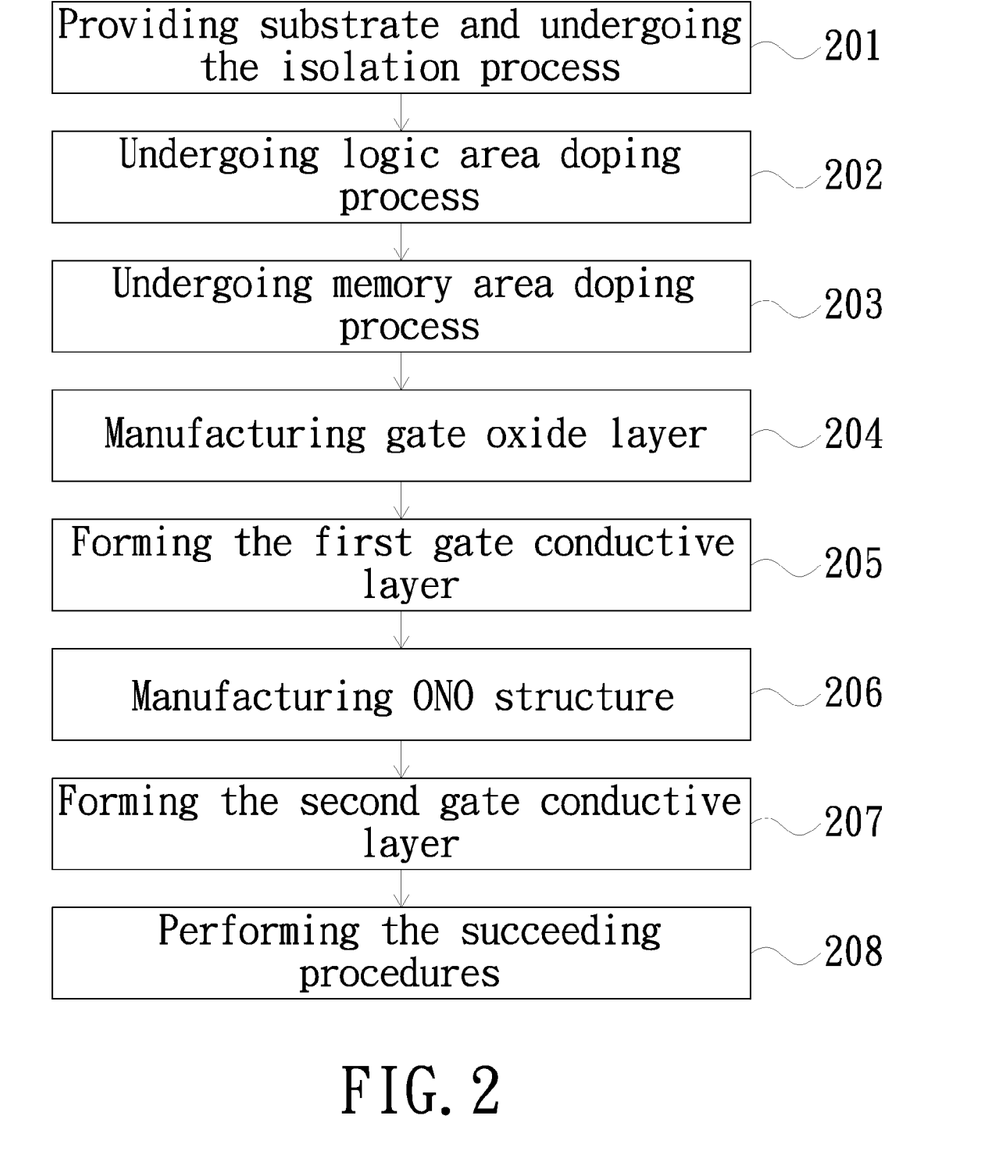
FIG. 2 is a flow diagram illustrates a SONOS memory manufacturing process in accordance with an embodiment of the present invention.
Figure 3A:
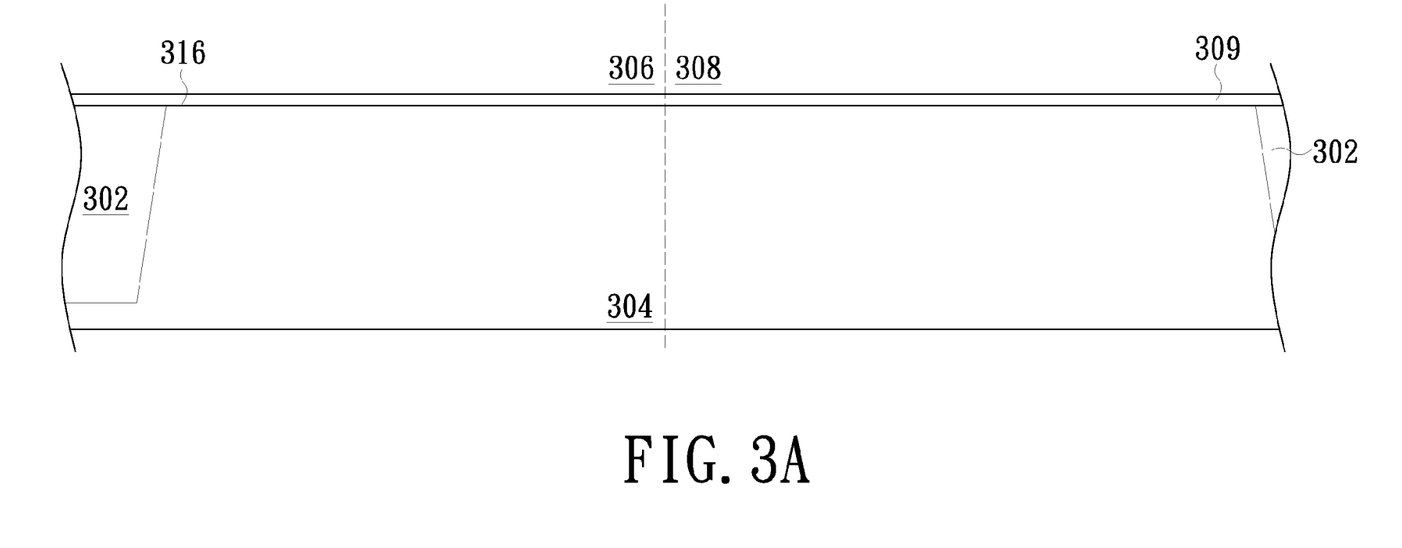
FIGS. 3A through 3G are process cross-sectional views corresponding to the SONOS memory manufacturing process shown in FIG. 2.

Please refer to FIG. 3A together with the step 201 shown in FIG. 2, a substrate (or wafer) 304 made of silicon is provided. A surface 316 of the substrate 304 is divided into a memory area 306 and a logic area 308, and a plurality of isolation structures 302 are formed, by an isolation process such as the shallow trench isolation(STI) or the local oxidation of silicon (LOCOS) process, on the substrate 304 to isolate the elements which will be formed later, including the memory cells, the NVM transistors in the memory area, and the MOS transistors in the logic area 308, to the other nearby elements on the substrate 304. A pad oxide layer 309 is further formed on the surface 316 of the substrate 304.

Figure 3B:
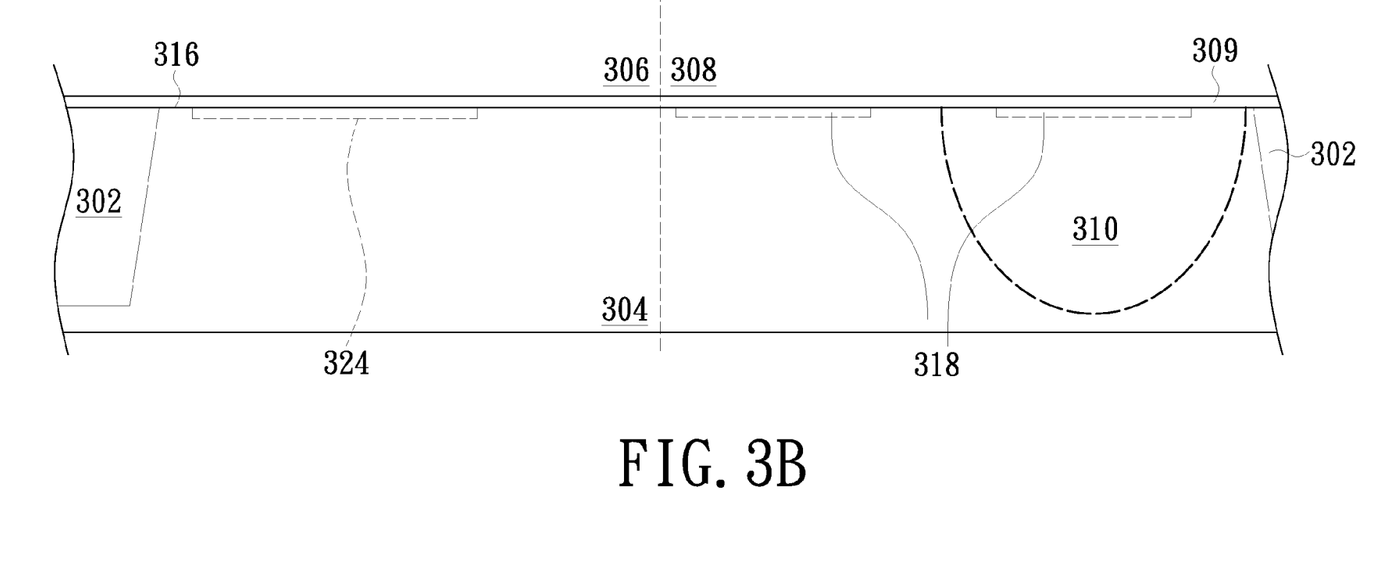

Please refer to FIG. 3B together with the steps 202 and 203 shown in FIG. 2, various wells or doped zones are formed by respective doping processes to the logic area 308 and the memory area 306, wherein the dopants penetrate through the pad oxide layer 309, and are doped into the substrate 304. A doped zone 310 shown in FIG. 3B is a deep N-well, while the doped zones 318/324 will serve as the channel of the MOS/NVM transistors, respectively.

Figure 3C:
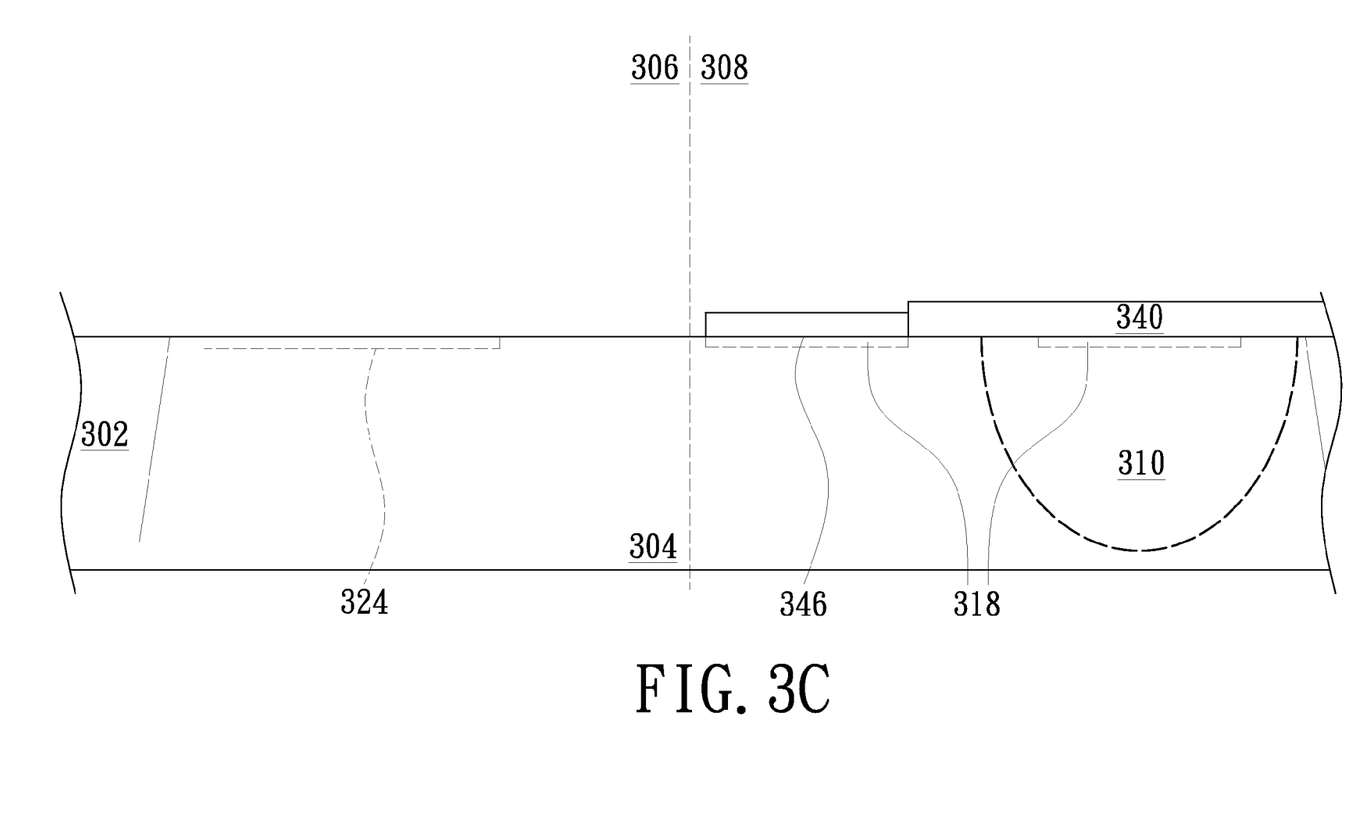

It is noticeable that, referring to FIG. 3C together with step 204 shown in FIG. 2, a first gate oxide layer 340 of the logic gate 308 is deposited before the depositions of the ONO structure in the memory area 306, which is different from the conventional SONOS memory manufacturing processes.

After a cleaning process for removing the pad oxide layer 309 of the surface 316, including which is located within the doped zone 318, the first gate oxide layer 340 shown in FIG. 3C is deposited on the whole surface 316. The second gate oxide layer 346 shown in FIG. 3C is selectively formed in the application of a low voltage MOS to construct the gate oxide structure of a low voltage MOS transistor corresponding to the high voltage MOS transistor with the gate oxide structure constructed by the first gate oxide layer 340.

Figure 3D:
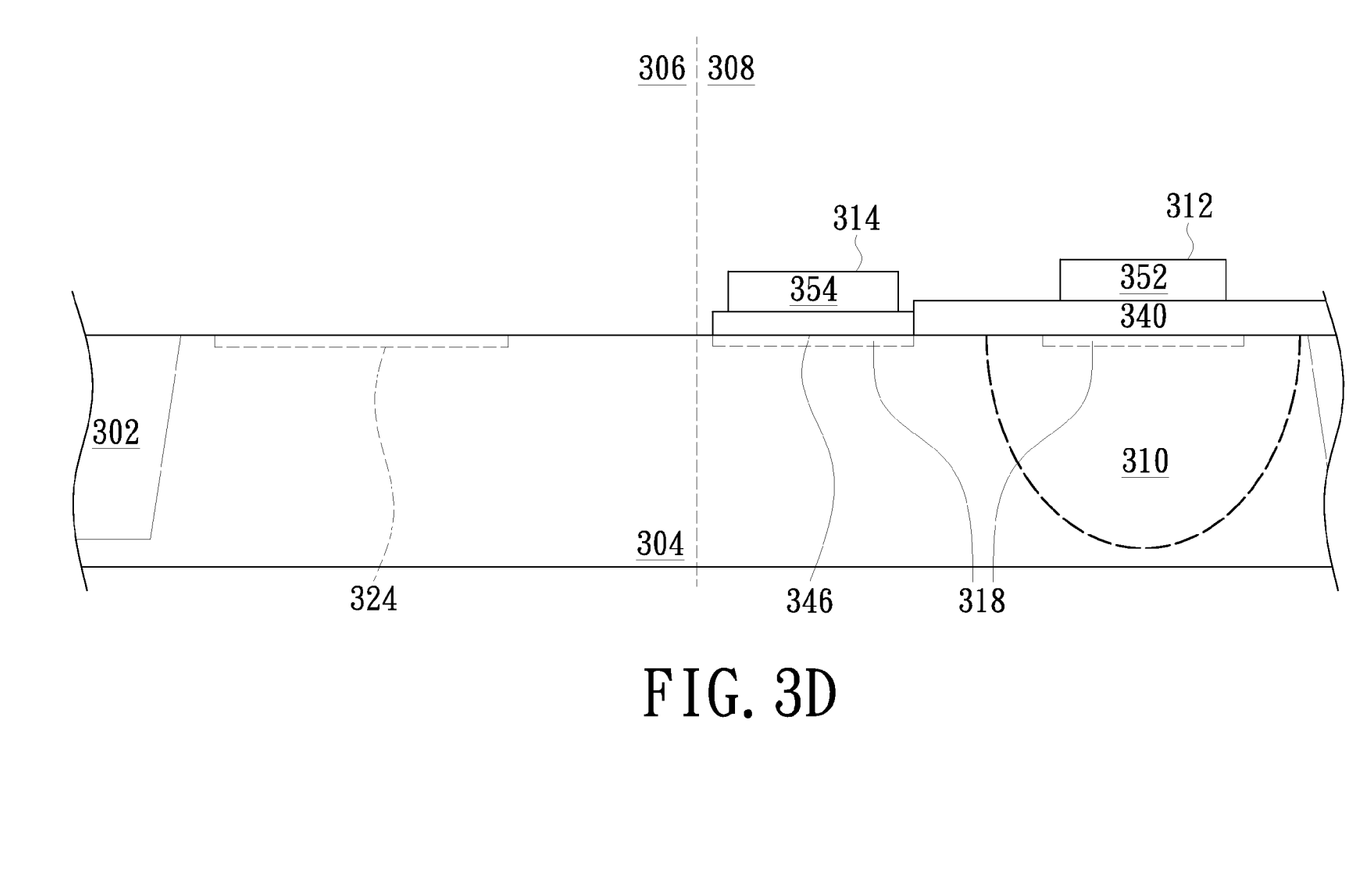
Figure 3E:
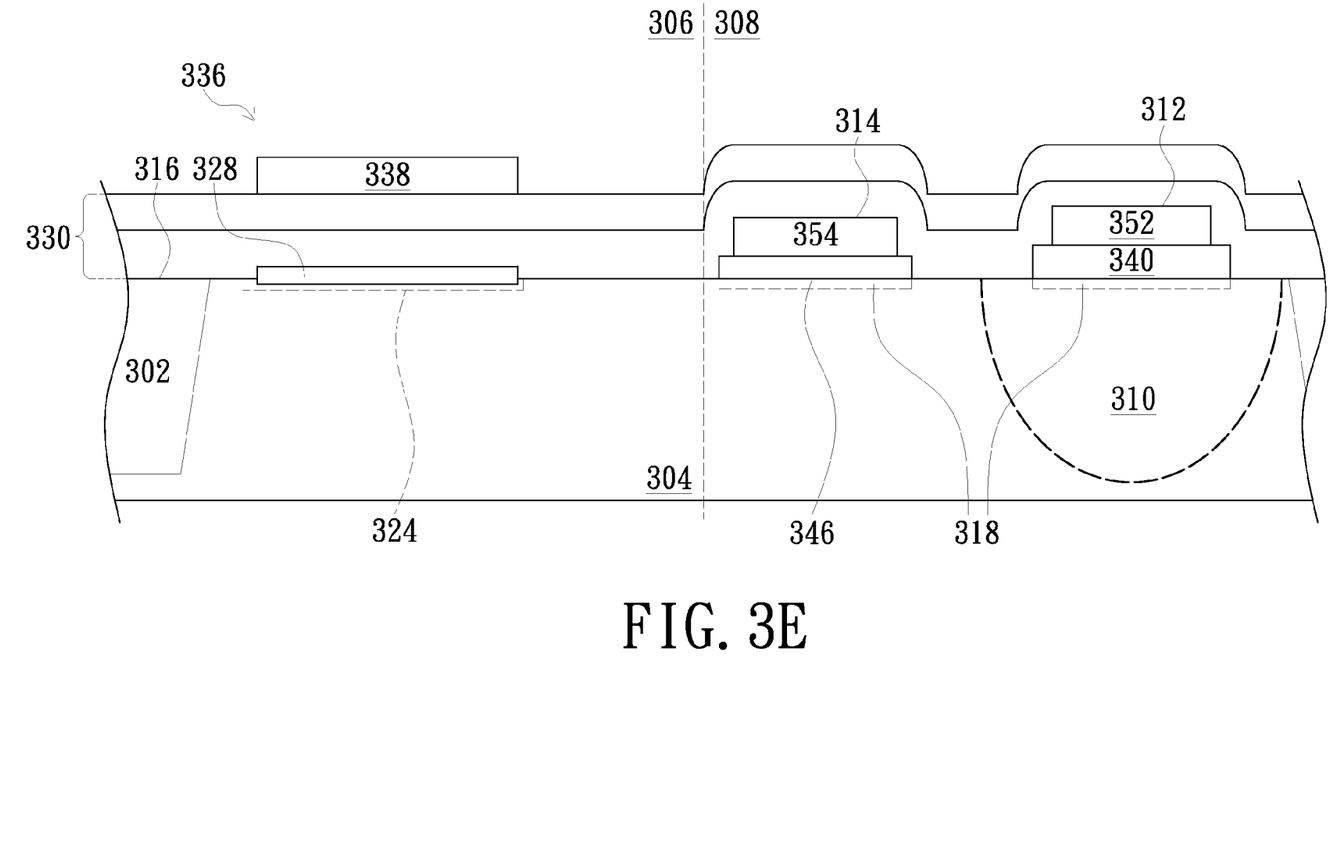

Then, as indicated by the step 205 shown in FIG. 2, the first gate conductive layer made by one of conductive materials such as polysilicon is formed on the surface 316 of the substrate 304, and a MOS transistor gate 352 is formed by executing a photolithography process on the first gate conductive layer 352. In the embodiment of a high voltage MOS, the gate 354 on the second gate oxide layer 346 is formed at the same time with the MOS transistor gate 352, so that a low voltage MOS transistor 314 corresponding to a high voltage MOS transistor 312 is made as shown in FIG. 3D. The ONO structure, as indicated by the step 206 shown in FIG. 2, will be constructed after cleaning the undesired portion of the first gate oxide layer 340. As shown in FIG. 3E, an ONO structure 336 is formed on the surface 316 of the substrate 304 by stacking the tunnel dielectric layer 328, the charge trapping layer 330 (ONO, including sub-layers 330a/330b as shown in FIG. 3G), and the blocking oxide layer 338. The variations and combinations of materials and forming methods for constructing the ONO structure 336 can be achieved by various conventional techniques, so that it will not be described in detail here. When etching a second gate conductive layer 350 as described later, a portion of the deposition layers of the ONO structure 336 (the charge trapping layer 330) covers the MOS transistor gate 352 of the MOS transistor 312 and serves as a hard mask.

Figure 3F:
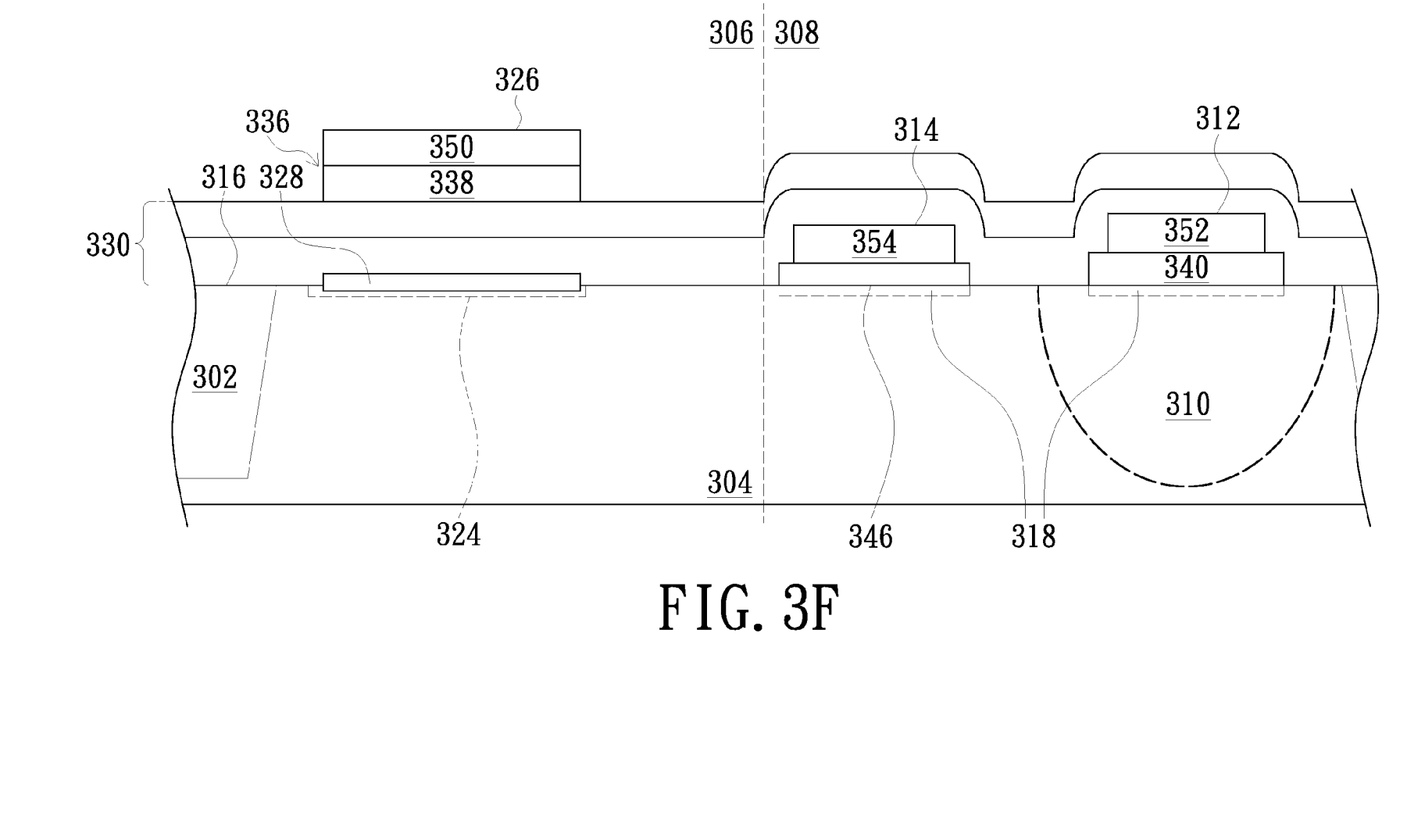
Figure 3G:
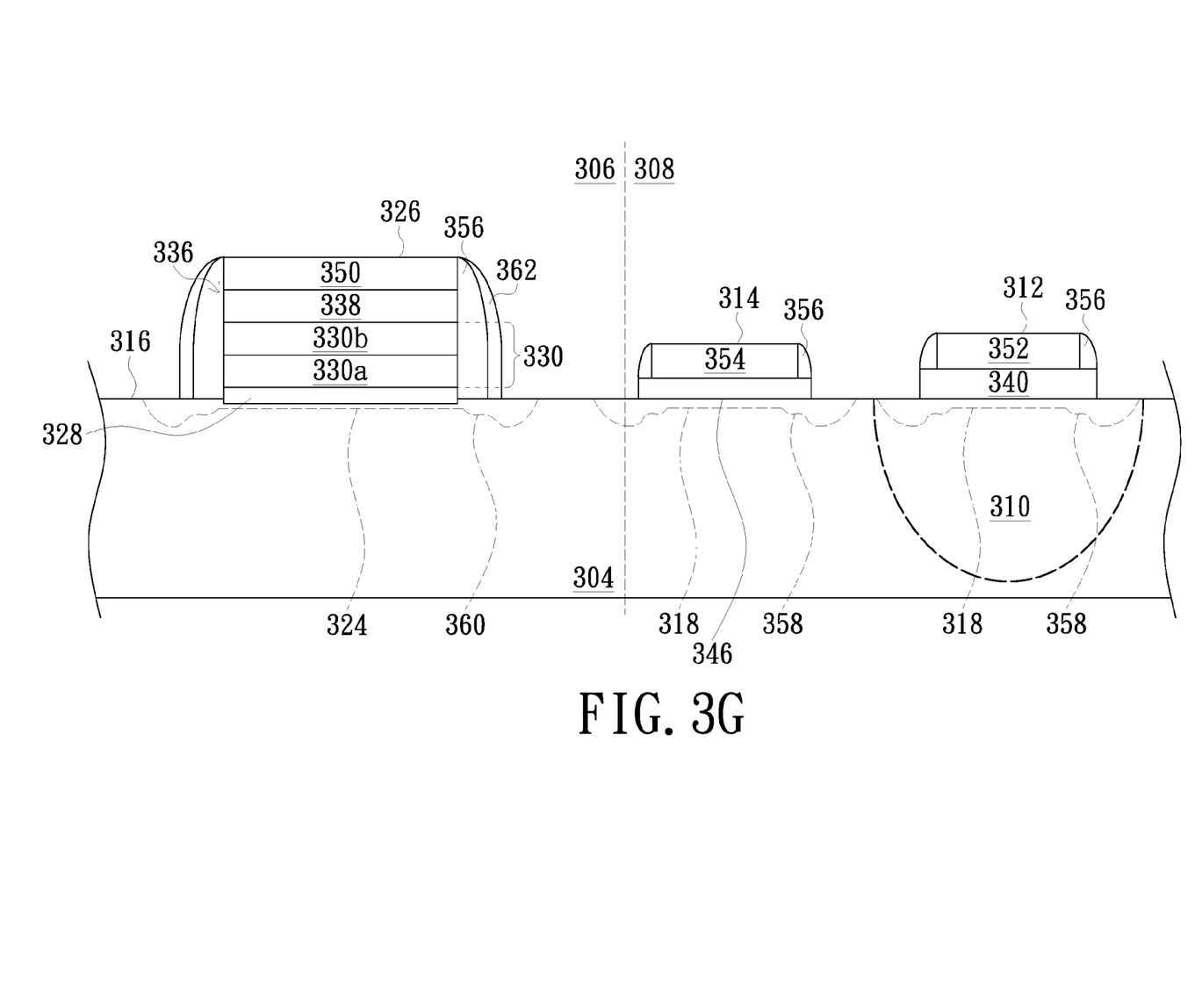

According to the step 207 shown in FIG. 2 and FIG. 3F, after forming ONO structure 336, the second gate conductive layer 350 composed by conductive materials such as polysilicon is deposited on the surface 316 of the substrate 304, and then a NVM transistor gate 350 is formed by executing a photolithography process on the second gate conductive layer 350. Accordingly, referring to step 208 shown in FIG. 2, the main structures of all transistors are constructed, and the remaining portions of NVM can be performed by standard procedures, e.g., steps for forming the lightly doped drains 358, 360 and the sidewall spacers 356, and the other portion of logic circuits (not shown). Finally, the NVM structure as shown in FIG. 3G is fabricated or achieved.

The order of steps for manufacturing the ONO structure 336 and the first gate oxide 340 is different from that of the conventional manufacturing process, which will cause a distinguishable construction feature between the NVM device according to the present invention and the conventional NVM device. Please refer to FIG. 3G together with FIG. 1, and it will be found that the junction of the ONO structure 336 and the substrate 304 is lower than the surface 316 and slightly sinks into the interior of the substrate 304. This is because the oxide layer has an intention of diffusing into the interior of a silicon substrate. Therefore, the level of an oxide layer and the silicon substrate will be lower than that of another oxide layer formed earlier. Similarly, the gate oxide layer 140/146 shown in FIG. 1 sink below the surface 116 of the substrate 104 and into the interior portion of the substrate 104 of the same reason. Such structural feature will be an important criteria for distinguishing the NVM devices manufactured according to embodiments of the method of the present invention.

Figure 4A:
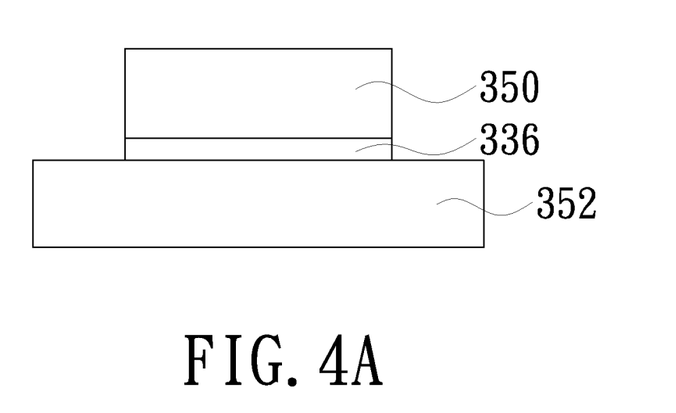
FIGS. 4A and 4B illustrate applications of the second gate conductive layer with adjustable resistance according to the present invention.
Figure 4B:
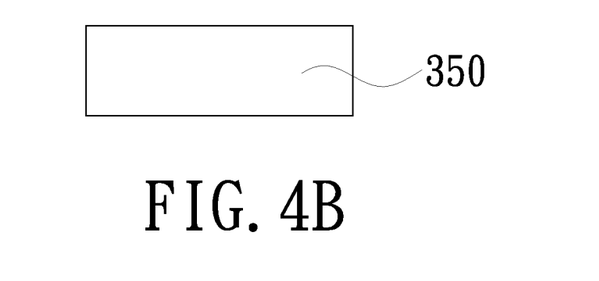

Since the NVM transistor gate 350 of the NVM transistor 326 and the MOS transistor gate 352 of the MOS transistor 312 are formed by different gate conductive layer fabricating processes, it is then possible to having different electrical resistances between them. Accordingly, the resistance of the second gate conductive layer 350 will not be limited by the resistance of the MOS transistor gate 352, and will be possible to have a desired value for high voltage applications. Furthermore, various derivative element structures and applications can be done by applying in-situ processes. For example, as shown in FIG. 4A, while etching the first gate conductive layer 352, a portion of the first gate conductive layer 352 which is not used for forming the MOS transistor gate 312 is remained for forming a capacitor structure with the ONO structure 336 and the second gate conductive layer 350. Furthermore, as have been mentioned, the resistance of the second gate conductive layer 350 is adjustable as desired. Accordingly, as shown in FIG. 4B, while etching the second gate conductive layer 350, a portion of the second gate conductive layer 350 which is not used for forming the NVM transistor gate 326 is remained for forming a resistor with a desired electrical resistance. Both of the manufacturing processes do not require to increase the number of photomasks.

To sum up, the present invention changes the manufacturing order of steps of the ONO structure and the gate oxide layer of the MOS transistor, and thus solves or improves the problems caused by the succeeding processes of the ONO structure in a conventional memory manufacturing, which will influence the quality of memory devices. Furthermore, since the gates of the NVM transistor and the MOS transistor are formed by different gate conductive layer processes, it is then possible to having different electrical resistances between them, and various derivative element structures and applications can be done without increasing the number of photomasks. While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a non-volatile memory with Silicon-Oxide-Nitride-Oxide-Silicon (SONOS) memory cells, comprising steps of:
   providing a substrate;
   forming a first gate oxide layer and a first gate conductive layer onto the substrate;
   forming a MOS transistor gate by executing a photolithography process on the first gate conductive layer, and then forming an Oxide-Nitride-Oxide (ONO) structure on the substrate; and forming a second gate conductive layer on the ONO structure, and then forming a non-volatile memory (NVM) transistor gate by executing a photolithography process on the second gate conductive layer.

2. The method according to claim 1, wherein when etching the second gate conductive layer, a charge trapping layer of the ONO structure serves as a hard mask of the MOS transistor gate.

3. The method according to claim 1, wherein while etching the first gate conductive layer, a portion of the first gate conductive layer which is not used for forming the MOS transistor gate is remained for forming a capacitor structure with the ONO structure.

4. The method according to claim 1, wherein while etching the second gate conductive layer, a portion of the second gate conductive layer which is not used for forming the NVM transistor gate is remained for forming a resistor with a desired electrical resistance.

* * * * *